(12) United States Patent
Figueroa et al.

(10) Patent No.: US 6,532,143 B2
(45) Date of Patent: Mar. 11, 2003

(54) MULTIPLE TIER ARRAY CAPACITOR

(75) Inventors: David G. Figueroa, Mesa, AZ (US); Kishore K. Chakravorty, San Jose, CA (US); Huong T. Do, Scottsdale, AZ (US); Larry Eugene Mosley, Sunnyvale, CA (US); Jorge Pedro Rodriguez, Chandler, AZ (US); Ken Brown, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,612

(22) Filed: Dec. 29, 2000

(65) Prior Publication Data

US 2002/0085334 A1 Jul. 4, 2002

(51) Int. Cl.7 .......................... H01G 4/30; H01L 31/119
(52) U.S. Cl. ................. 361/301.4; 361/306.3; 361/303; 361/387; 361/718; 257/296; 257/297
(58) Field of Search .............................. 361/301.4, 385, 361/386, 387, 388, 389, 748, 745, 734, 718, 306.3, 302, 303, 313, 301.1; 257/698, 700, 296, 297

(56) References Cited

U.S. PATENT DOCUMENTS

| | | | | |
|---|---|---|---|---|
| 4,729,061 A | * | 3/1988 | Brown .................. | 361/386 |
| 5,874,770 A | * | 2/1999 | Saia et al. ............. | 257/536 |
| 5,939,782 A | * | 8/1999 | Malladi ................. | 257/698 |
| 6,262,446 B1 | * | 7/2001 | Koo et al. ............. | 257/296 |
| 6,346,743 B1 | * | 2/2002 | Figueroa et al. ...... | 257/273 |
| 6,351,369 B1 | * | 2/2002 | Kuroda et al. | |
| 6,414,835 B1 | * | 7/2002 | Wolf et al. | |

\* cited by examiner

Primary Examiner—Dean A. Reichard
Assistant Examiner—Nguyen T Ha
(74) Attorney, Agent, or Firm—Schwegman, Lundberg, Woessner & Kluth, P.A.

(57) ABSTRACT

A capacitor includes multiple tiers (302, 304, 306, 1210, 1212, 1310, 1312, 1380, FIGS. 3, 12, 13), which provide capacitance to a load at different inductance values. Each tier includes multiple layers (311–325, 1220, 1222, 1320, 1322, 1382, FIGS. 3, 12, 13) of patterned conductive material, which are separated by layers of dielectric material. In one embodiment, tiers are stacked in a vertical direction, and are electrically connected through vias (330, 332, 334, 1230, 1232, FIGS. 3, 12) that extend through some or all of the tiers. In another embodiment, one or more tiers (1310, 1312, FIG. 13) are located in a center region (1404, FIG. 14) of the capacitor, and one or more other tiers (1380, FIG. 13) are located in a peripheral region (1408, FIG. 14) of the capacitor. In that embodiment, the center tiers and peripheral tiers are electrically connected through one or more additional layers (1370, FIG. 13) of patterned conductive material. The capacitors of the various embodiments can be used as discrete devices, which are mountable on or embeddable within a housing (e.g., a package, interposer, socket or PC board), or they can be integrally fabricated within the housing.

14 Claims, 15 Drawing Sheets

MULTIPLE TIER ARRAY CAPACITOR

FIELD OF THE INVENTION

The present invention relates generally to apparatus for providing capacitance to an electronic circuit, and more particularly to providing capacitance to an integrated circuit load, and methods of capacitor and housing fabrication.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. This noise can arise due to inductive and capacitive parasitics, for example, as is well known. To reduce such noise, capacitors known as decoupling capacitors are often used to provide a stable signal or stable supply of power to the circuitry.

Capacitors are further utilized to dampen voltage overshoot when an electronic device (e.g., a processor) is powered down, and to dampen voltage droop when the device powers up. For example, a processor that begins performing a calculation may rapidly need more current than can be supplied by the on-chip capacitance. In order to provide such current and to dampen the voltage droop associated with the increased load, off-chip capacitance should be available to respond to the current need within a sufficient amount of time. If insufficient current is available to the processor, or if the response time of the capacitance is too slow, the die voltage may collapse to a level that affects the processor's performance. The localized portions of a die that require large amounts of current in short periods of time are often referred to as die "hot spots."

Decoupling capacitors and capacitors for dampening voltage overshoot or droop are generally placed as close as practical to a die load or hot spot in order to increase the capacitors' effectiveness. Often, the decoupling capacitors are surface mounted to the die side or land side of the package upon which the die is mounted. FIG. 1 illustrates a cross-section of an integrated circuit package 102 having die side capacitors 106 and land side capacitors 108 in accordance with the prior art. Die side capacitors 106, as their name implies, are mounted on the same side of the package as the integrated circuit die 104. In contrast, land side capacitors 108 are mounted on the opposite side of the package 102 as the die 104.

FIG. 2 illustrates an electrical circuit that simulates the electrical characteristics of the capacitors illustrated in FIG. 1. The circuit shows a die load 202, which may require capacitance or noise dampening in order to function properly. Some of the capacitance can be supplied by capacitance, modeled by capacitor 204, located on the die. Other capacitance, however, must be provided off chip, as modeled by off-chip capacitor 206. The off-chip capacitor 206 could be, for example, the die side capacitors 106 and/or land side capacitors 108 illustrated in FIG. 1. The off-chip capacitor 206 may more accurately be modeled as a capacitor in series with some resistance and inductance. For ease of illustration, however, off-chip capacitor 206 is modeled as a simple capacitor.

Naturally, the off-chip capacitor 206 would be located some distance, however small, from the die load 202, due to manufacturing constraints. Accordingly, some inductance, modeled by inductor 208, exists between the die load and off-chip capacitor 206. Because inductor 208 tends to slow the response time of off-chip capacitor 206, it is desirable to minimize the electrical distance between off-chip capacitor 206 and die load 202, thus reducing the value of inductor 208. This can be achieved by placing off-chip capacitor 206 as electrically close as possible to the die load.

Referring back to FIG. 1, die side capacitors 106 are mounted around the perimeter of the die 104, and provide capacitance to various points on the die through traces and vias (not shown) and planes in the package 102. Because die side capacitors 106 are mounted around the perimeter of the die, the path length between a hot spot and a capacitor 106 may result in a relatively high inductance feature between the hot spot and the capacitor 106.

In contrast, land side capacitors 108 can be mounted directly below die 104, and thus directly below some die hot spots. Thus, in some cases, land side capacitors 108 can be placed electrically closer to the die hot spots than can die side capacitors 106, resulting in a lower inductance path to between the die hot spot and capacitors 108. However, the package also includes connectors (not shown), such as pins or lands, located on its land side. In some cases, placement of land side capacitors 108 on the package's land side would interfere with these connectors. Thus, the use of land side capacitors 108 is not always an acceptable solution to the inductance problem.

Besides the inductance issues described above, additional issues are raised by the industry's trend to continuously reduce device sizes and packing densities. Because of this trend, the amount of package real estate available to surface-mounted capacitors is becoming smaller and smaller.

As electronic devices continue to advance, there is an increasing need for higher levels of capacitance at reduced inductance levels for decoupling, voltage dampening, and supplying charge. In addition, there is a need for capacitance solutions that do not interfere with package connectors, and which do not limit the industry to certain device sizes and packing densities. Accordingly, there is a need in the art for alternative capacitance solutions in the fabrication and operation of electronic devices and their packages.

DETAILED DESCRIPTION OF THE INVENTION

Various embodiments of the present invention provide a multiple tier capacitor, which can be used to provide additional charge, decoupling capacitance, and voltage dampening to a load at low inductance levels. Each tier provides capacitance at a different inductance value, and includes multiple layers of patterned conductive material separated by multiple layers of dielectric material. In one embodiment, tiers are stacked in a vertical direction, and are electrically connected through vias that extend through some or all of the tiers. In another embodiment, one or more tiers are located in a center region of the capacitor, and one or more other tiers are located in a peripheral region of the capacitor. In that embodiment, the center tiers and peripheral tiers are electrically connected through one or more additional layers of patterned conductive material. The capacitors of the various embodiments can be used as discrete devices, which are mountable on or embeddable within a housing (e.g., a package, interposer, socket or printed circuit board), or they can be integrally fabricated within the housing.

Figure 1:
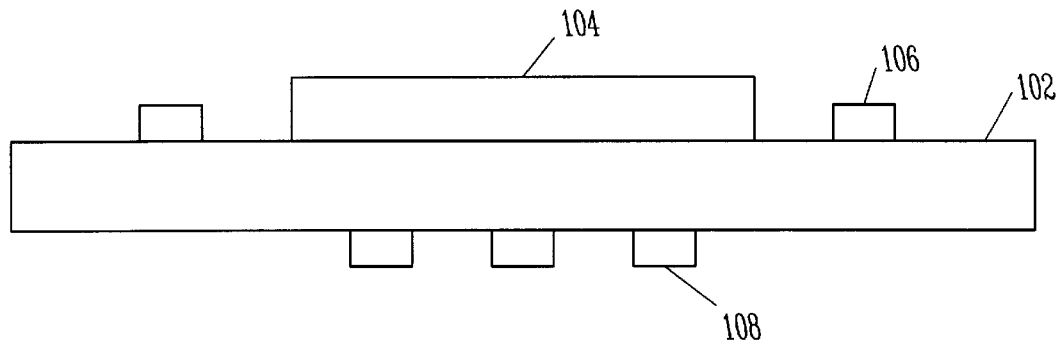
FIG. 1 illustrates a cross-section of an integrated circuit package having die side and land side capacitors in accordance with the prior art.
Figure 2:
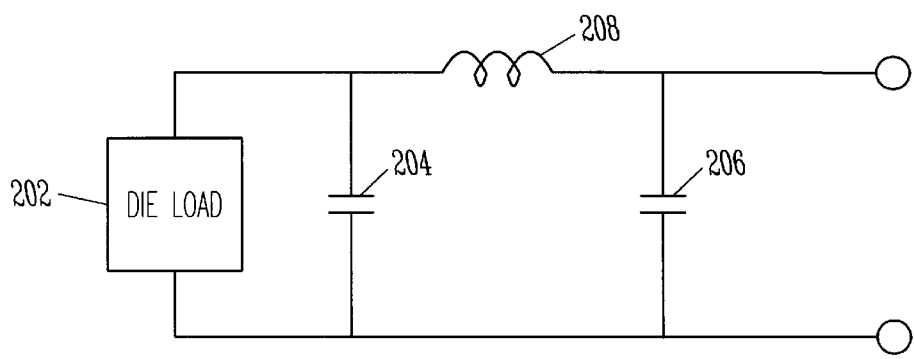
FIG. 2 illustrates an electrical circuit that simulates the electrical characteristics of the capacitors illustrated in FIG. 1.
Figure 3:
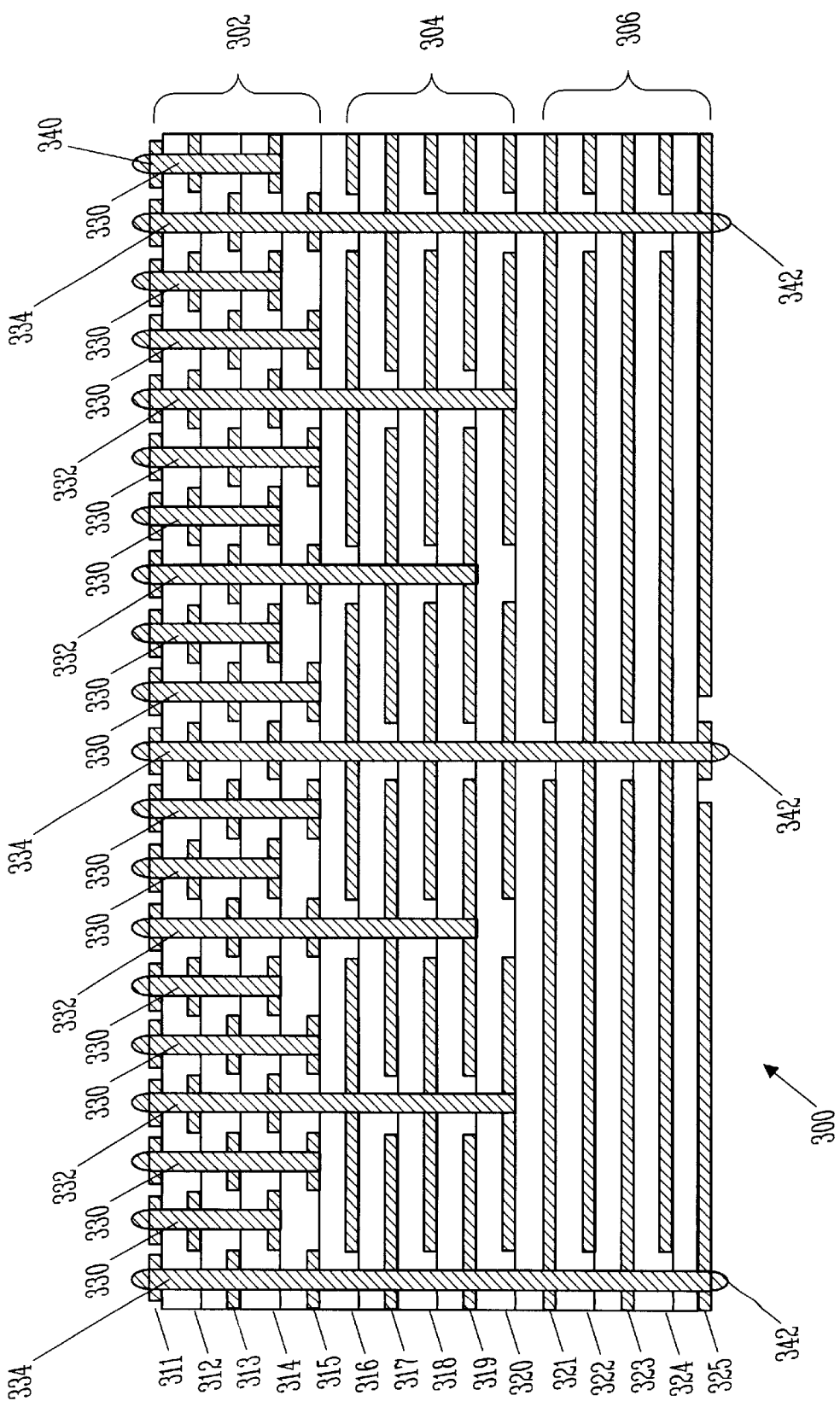
FIG. 3 illustrates a cross-section of a multiple tier array capacitor in accordance with one embodiment of the present invention.

FIG. 3 illustrates a cross-section of a multiple tier array capacitor 300 in accordance with one embodiment of the present invention. In various embodiments, capacitor 300 could be a ceramic capacitor, aluminum oxide capacitor, or a capacitor made with virtually any other technology, as would be obvious to one of skill in the art based on the description herein.

In one embodiment, capacitor 300 is a discrete device, which can be electrically connected to an integrated circuit, to the die side or land side of an electronic circuit package, or to an interposer, socket or printed circuit (PC) board. As a discrete device, capacitor 300 also could be embedded within a package, interposer, socket or PC board. In an alternate embodiment, which will be described in conjunction with FIGS. 12–15, capacitor 300 can be integrally fabricated within a package, interposer, socket or PC board.

Capacitor 300 includes two or more tiers 302, 304, 306 of capacitance, in one embodiment. Each tier 302, 304, 306 includes multiple layers 311–325 of patterned conductive material. In the configuration shown, top tier 302 includes layers 311–315, middle tier 304 includes layers 316–320, and bottom tier 306 includes layers 321–325. Each layer 311–325 of patterned conductive material is separated by a dielectric layer, and each set of adjacent layers and intermediate dielectric layers form a parallel plate capacitor. Thus, for example, layers 311 and 312 form a parallel plate capacitor, as do layers 313 and 314, etcetera.

The tiers 302, 304, 306 and layers 311–325 of patterned conductive material are electrically connected through conductive vias 330, 332, 334, referred to herein as "capacitor vias," which extend downward from the top surface of the capacitor. Some of the vias 330, 332, 334 associated with a tier make contact with every other layer of the tier, while others of the vias 330, 332, 334 associated with the tier make electrical contact with the remainder of the layers of the tier.

In this manner, the layers can alternate between being connected to power and ground (e.g., Vcc and Vss), thus providing a capacitive charge across each set of adjacent layers. Thus, layers 311, 313, 315, 317, 319, 321, 323, and 325 can be connected to power, and layers 312, 314, 316, 318, 320, 322, and 324 can be connected to ground, or vice versa. In one embodiment, vias 334 extend to the bottom surface of the capacitor. Accordingly, electrical connections can be made through top connectors 340 and/or bottom connectors 342. In another embodiment, connections could also be made through, side terminated connectors (not shown), which make electrical contact with the layers along the vertical sides of capacitor 300.

In the embodiment shown in FIG. 3, tiers 302, 304, 306 are stacked in a vertical direction. Thus, tiers 304 and 306 are located substantially underneath tier 302. Accordingly, the capacitor vias 332 that extend through the middle tier 304 extend also through the layers 311–315 of the top tier 302, making electrical contact with every other one of the layers in the top tier 302. In addition, the capacitor vias 334 that extend through the bottom tier 306 extend also through the layers 311–320 of the top and middle tiers 302, 304, making electrical contact with every other one of the layers in the top and middle tiers 302, 304. In an alternate embodiment, some of all of the vias 332, 334 that extend through the middle and bottom tiers 304, 306 could be insulated from the layers of the top and middle tiers 302, 304.

Although three tiers 302, 304, 306 of capacitance are shown in FIG. 3, more or fewer tiers could be implemented in various embodiments. In addition, although each tier 302, 304, 306 is shown to have five layers, more or fewer layers could be included in each tier. Additionally, although the layers 311–325 and tiers 302, 304, 306 are shown to be adjacent to each other, the various layers 311–325 and/or tiers 302, 304, 306 could be separated from each other by one or more signal-carrying or other layers. Also, the number of vias 330, 332, 334 connecting through each tier 302, 304, 306, and the number of top connectors 340 and/or bottom connectors 342 could be different from the numbers shown in FIG. 3.

The number of vias 330, 332, 334 that connect to and pass through the layers 311–325 within each tier 302, 304, 306 affects the inductance and capacitance of the tier. Basically, the number of vias is inversely proportional to the inductance and capacitance of each tier.

The capacitance value of each tier 302, 304, 306 is proportional to the area of the conductive layers 311–325 that comprise the tier and the thickness of the dielectric layers between sets of conductive layers 311–325. As will be explained in more detail in conjunction with FIGS. 5–7, conductive layers 311–315 in top tier 302 have multiple via through holes, which enable vias 330, 332, 334 to pass through to lower layers. Each via through hole that passes through a layer 311–315 decreases the conductive area of the layer. In one embodiment, top tier 302 has a greater number of vias 330, 332, 334 that connect to and pass through its layers 311–315. Middle tier 304 has fewer vias 332, 334 connecting to and passing through its layers 316–320, and bottom tier 306 has even fewer vias 334 connecting to and passing through its layers 321–325. Thus, the conductive areas of top tier layers 311–315 is the smallest of three tiers, and the conductive areas of bottom tier layers 321–325 is the greatest of the three tiers. Accordingly, top tier 302 has the lowest inductance and capacitance of the three tiers 302, 304, 306, and bottom tier 306 has the highest inductance and capacitance of the three tiers 302, 304, 306.

Besides being inversely proportional to the number of vias connecting to and passing through each tier, the inductance of each tier 302, 304, 306 is proportional to the distance of the tier from the load. Because the load will be connected to the top of the capacitor, in one embodiment, top tier 302 is closest to the load, middle tier 304 is farther from the load, and bottom tier 306 is the farthest from the load. Accordingly, top tier 302 has the lowest inductance to the load, middle tier 304 has more inductance, and bottom tier 306 has the greatest inductance.

Because of the above-described inductance and capacitance characteristics, a tier can be defined as a set of layers having particular inductance and capacitance values. These concepts are illustrated further using a simulation of the electrical characteristics of capacitor 300.

Figure 4:
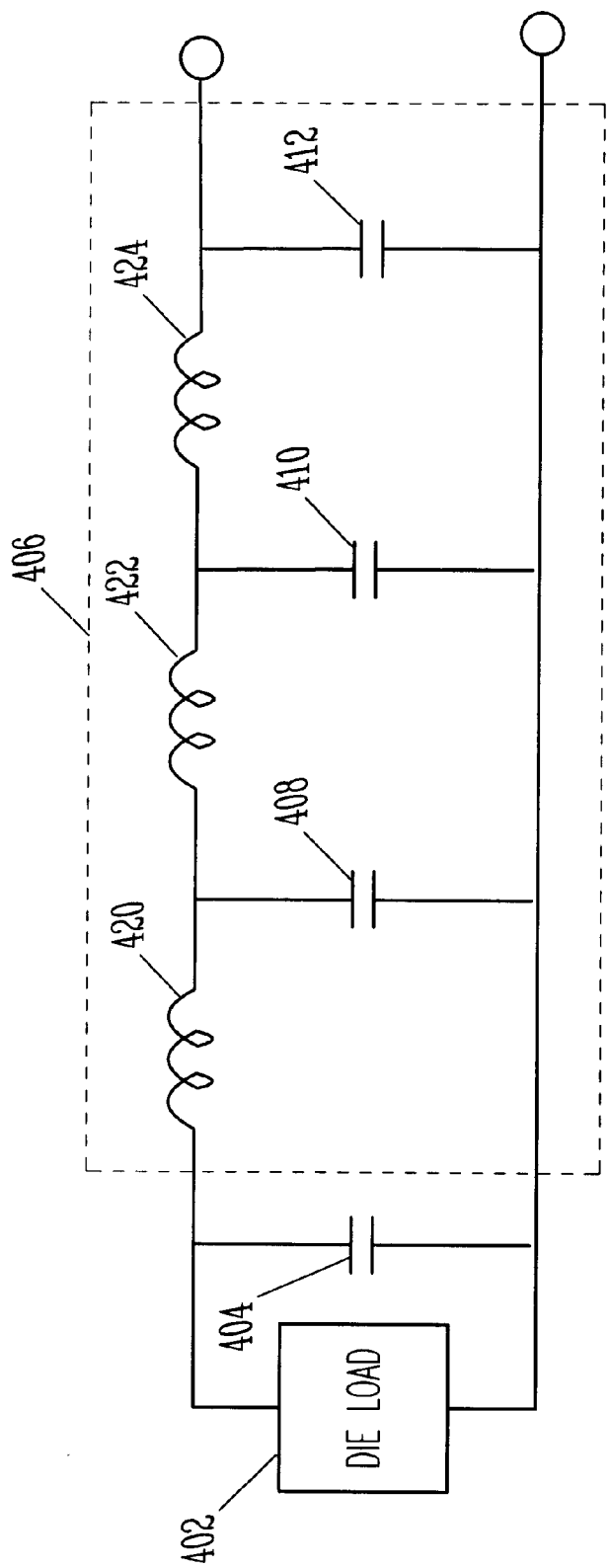
FIG. 4 illustrates an electrical circuit that simulates the electrical characteristics of the capacitor illustrated in FIG. 3.

FIG. 4 illustrates an electrical circuit that simulates the electrical characteristics of the capacitor illustrated in FIG. 3. The circuit shows a die load 402, which may require capacitance or noise dampening in order to function properly. Some of the capacitance can be supplied by capacitance 404 located on the die. Additional capacitance is provided off chip by capacitor 406, which is a capacitor having a structure such as that shown in FIG. 3, in one embodiment.

Capacitor 406 is modeled as three capacitors 408, 410, 412 in parallel, each separated from die load 402 by some inductance 420, 422, 424. Each of capacitors 408, 410, 412 could more accurately be modeled as a capacitor in series with some resistance and inductance. For ease of illustration, however, capacitors 408, 410, 412 are modeled as simple capacitors.

Referring also to FIG. 3, capacitor 408 represents the top tier 302, capacitor 410 represents the middle tier 304, and capacitor 412 represents the bottom tier 306. For reasons described above, capacitor 408 has the lowest capacitance value, but also has the lowest inductance 420 to load 402. Capacitor 410 has a higher capacitance value and a higher inductance 422 to load 402. Finally, capacitor 412 has the highest capacitance value and highest inductance 424 to load 402.

The higher the inductance 420, 422, 424, the slower the response time of capacitors 408, 410, 412. Thus, when high frequency transients or a voltage droop occurs, capacitor 408 (e.g., tier 302, FIG. 3) will respond first, as it has the lowest inductance to die load 402. Although the amount of capacitance supplied by capacitor 408 is relatively small, its design should be such that capacitor 408 will provide enough capacitance for the highest expected frequency transients.

Additional capacitance at lower frequencies is supplied by capacitor 410 (e.g., tier 304, FIG. 3) and then capacitor 412 (e.g., tier 306, FIG. 3). Although the inductance to these capacitors 410, 412 is higher, with a slower response time, the total capacitance available to die load 402 is greater than it would be if only capacitor 408 were available.

Referring back to FIG. 3, and as mentioned previously, the number of vias 330, 332, 334 connecting to the layers 311–325 of each tier 302, 304, 306 is inversely proportional to the inductance and capacitance of the tier. In addition, top tier 302 has the most vias 330, 332, 334 connecting its layers 311–315, middle tier 304 has fewer vias 332, 334, and bottom tier 306 has the fewest vias 334. Thus, as is described in conjunction with FIGS. 5–7, the layers 311–325 in each successive tier 302, 304, 306 have fewer and fewer via holes.

Figure 5:
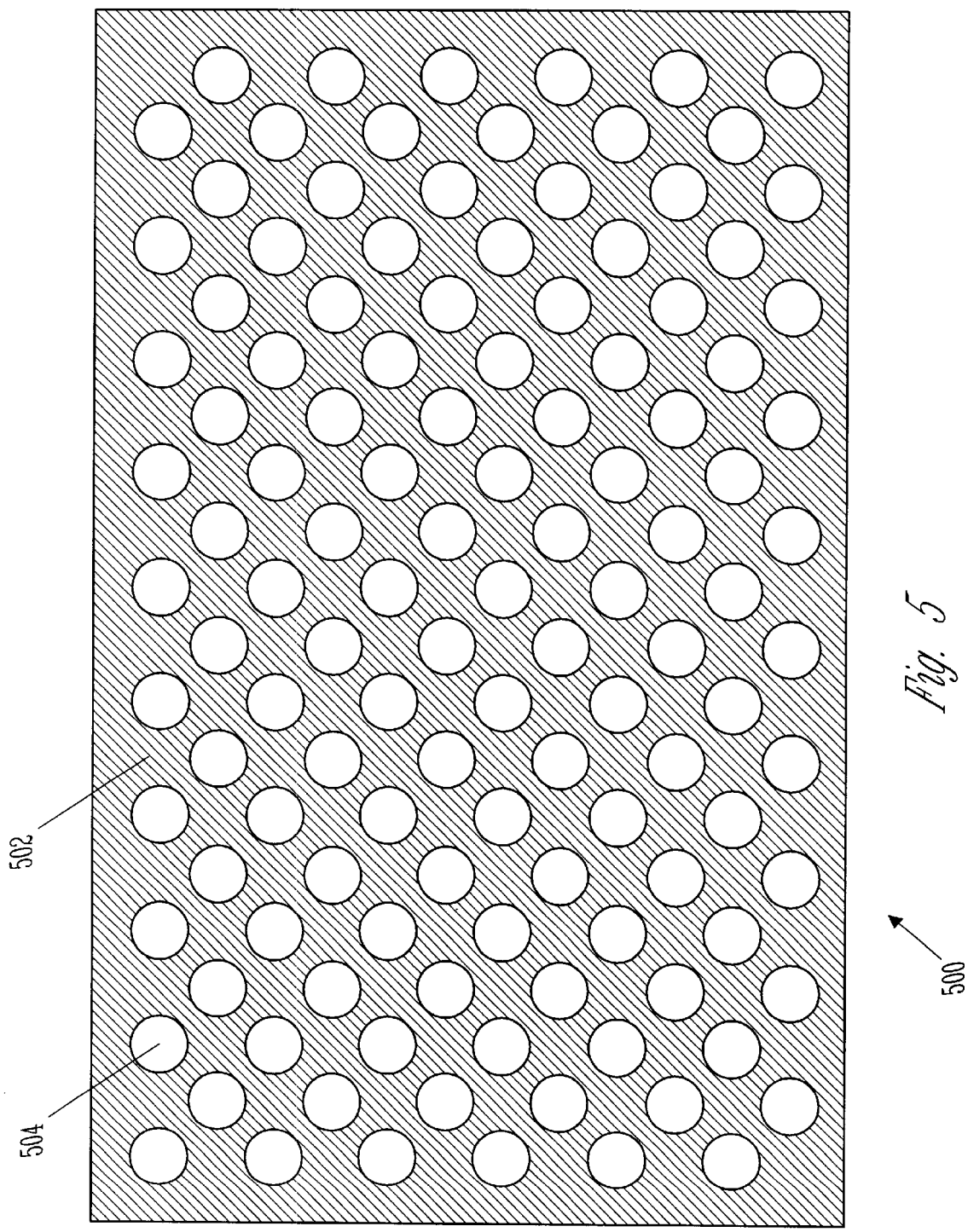
FIG. 5 illustrates a top view of a power or ground plane conductive layer for a first tier of a multiple tier array capacitor in accordance with one embodiment of the present invention.

FIG. 5 illustrates a top view of a power or ground plane conductive layer 500 (e.g., one of layers 311–315, FIG. 3) for a first tier (e.g., tier 302, FIG. 3) of a multiple tier array capacitor in accordance with one embodiment of the present invention. Layer 500 comprises conductive material 502 through which holes 504 are formed.

When layer 500 is integrated into a capacitor (e.g., capacitor 300, FIG. 3), some vias (e.g., vias 330, 332, 334, FIG. 3) extend through holes 504 without making electrical contact with conductive material 502. These vias, referred to herein as "insulated vias," have a diameter that is smaller than holes 504, and they make electrical contact with other layers (not shown) just above and/or just below layer 500. Other vias are formed through conductive material 502 in the areas between holes 504. These vias, referred to herein as "contact vias," make electrical contact with layer 500, but not with the layers (not shown) just above and/or just below layer 500. Accordingly, if layer 500 is connected to ground, multiple contact vias would be formed through conductive material 502, and multiple insulated vias would extend through holes 504.

Because adjacent layers are connected to power and ground, respectively, the pattern of conductive material 502 for each subsequent layer within a tier is shifted, in one embodiment. In other words, for an adjacent layer just above or just below layer 500, the adjacent layer's holes would align with the conductive material 502, and the adjacent layer's conductive material would align with holes 504. In this manner, a single via that extends through both layers would be insulated from one of the layers, and would make electrical contact with the adjacent layer.

In one embodiment, the pitch (i.e., the center to center distance) between holes 504 is in a range of 200–500 microns, although the pitch between holes 504 could be larger or smaller in other embodiments. In general, when the pitch between holes 504 is small, the inductance is lower, but the capacitance is also lower. When the pitch between holes 504 is large, the capacitance is higher, but the inductance is also higher. The pitch between holes 504 could be larger or smaller, as well, depending on the type of capacitor (e.g., ceramic, aluminum oxide, etc.).

As illustrated in FIG. 3, each consecutively lower tier 302, 304, 306 has fewer and fewer vias 330, 332, 334 connecting to its layers 311–325. Accordingly, the layers 311–325 for each consecutively lower tier 302, 304, 306 have fewer and fewer holes. This is illustrated in FIGS. 6 and 7.

Figure 6:
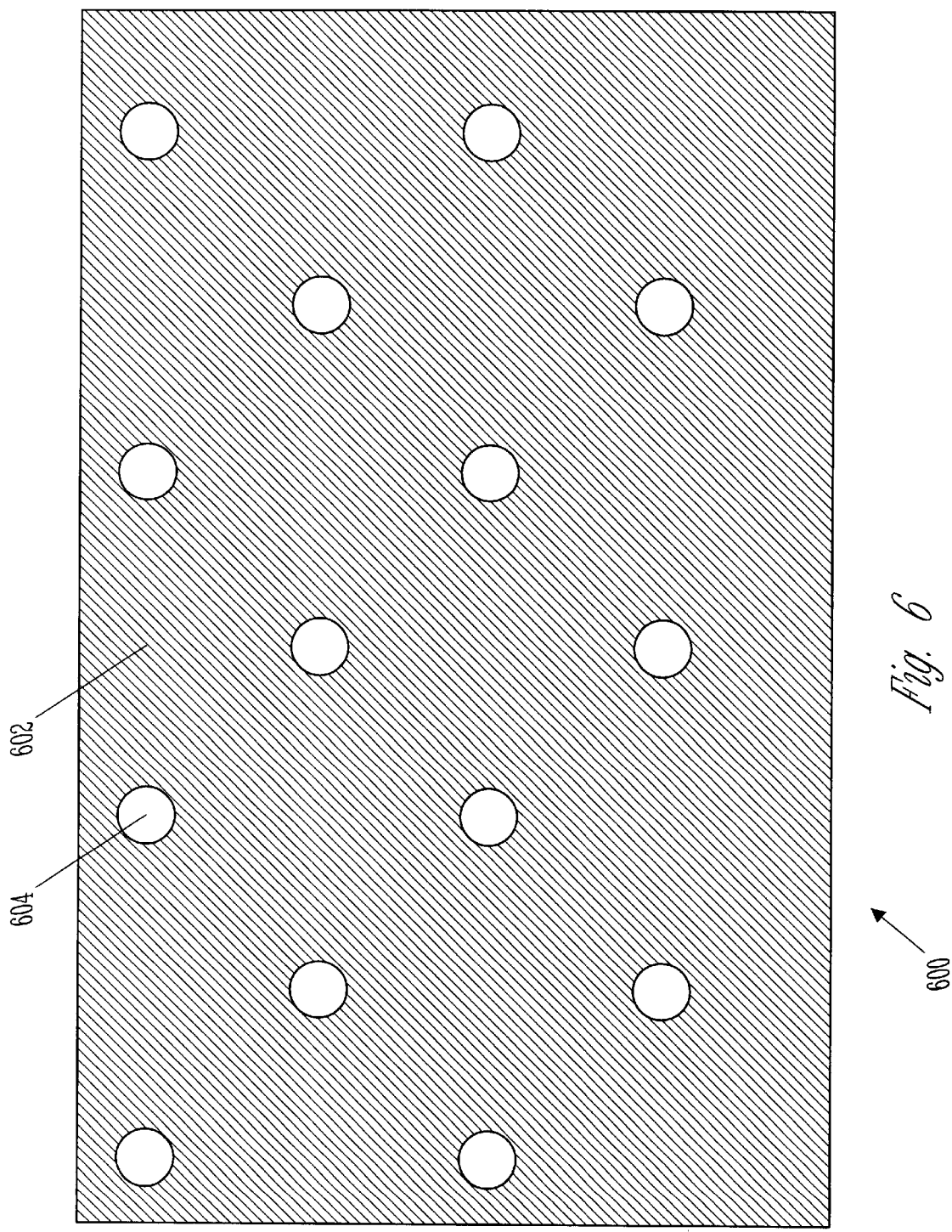
FIG. 6 illustrates a top view of a power or ground plane conductive layer for a second tier of a multiple tier array capacitor in accordance with one embodiment of the present invention.

FIG. 6 illustrates a top view of a power or ground plane conductive layer 600 for a second tier (e.g., tier 304, FIG. 3) of a multiple tier array capacitor in accordance with one embodiment of the present invention. Layer 600 comprises conductive material 602 through which holes 604 are formed. Similar to layer 500 (FIG. 5), insulated vias extend through holes 604, and contact vias are formed through the conductive material 602 between holes 604. In this manner, adjacent layers within the tier can be connected to power and ground, respectively, forming a parallel plate capacitor.

Contrasting layer 600 from layer 500 (FIG. 5), it is apparent that layer 600 has substantially fewer holes 604 through its conductive material 602. Because layer 600 has more conductive surface area, when layer 600 and an adjacent layer (not shown) are used to form a parallel plate capacitor, they are capable of storing more charge than a capacitor formed from layer 500 and an adjacent layer.

Figure 7:
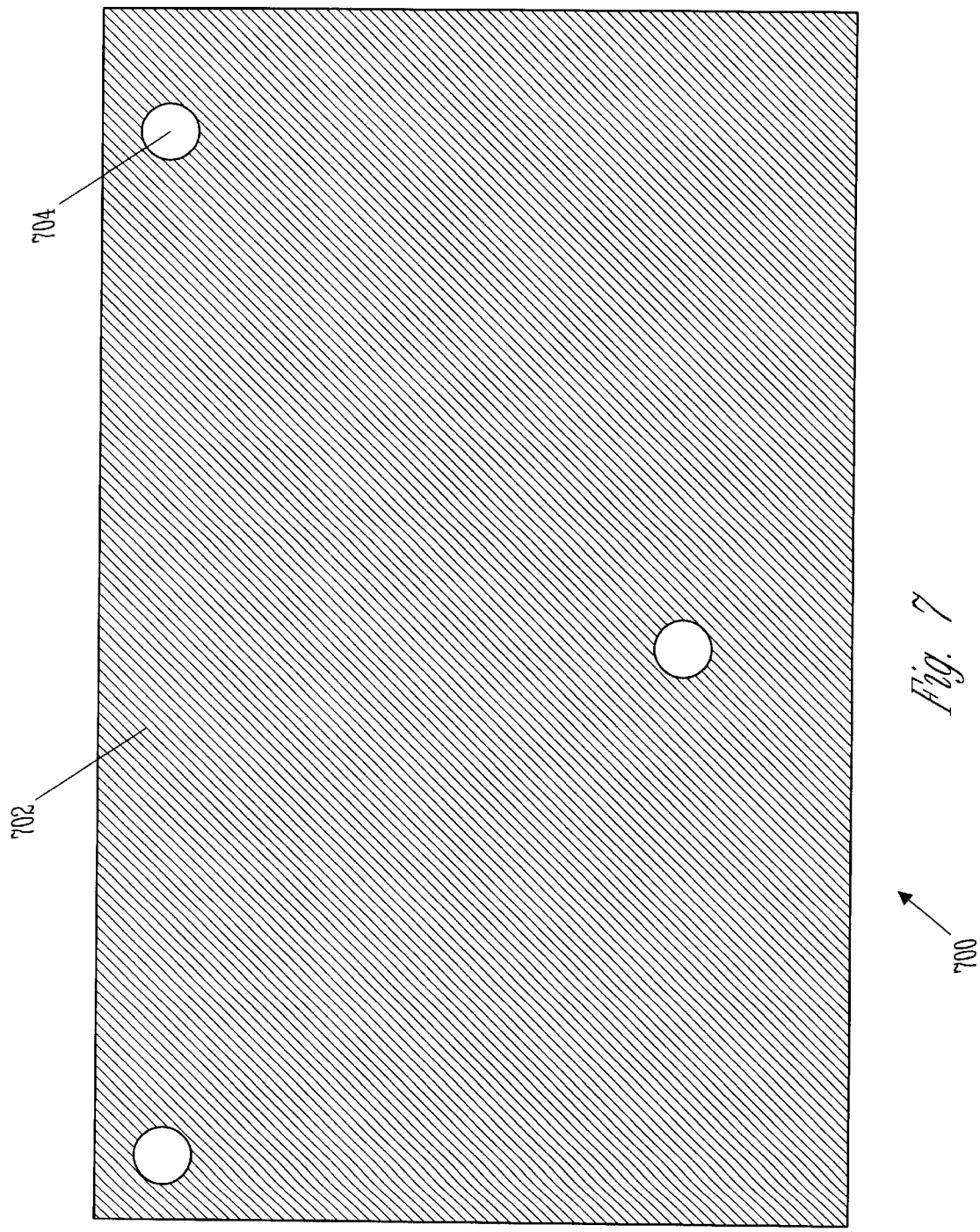
FIG. 7 illustrates a top view of a power or ground plane conductive layer for a third tier of a multiple tier array capacitor in accordance with one embodiment of the present invention.

FIG. 7 illustrates a top view of a power or ground plane conductive layer 700 for a third tier (e.g., tier 306, FIG. 3) of a multiple tier array capacitor in accordance with one embodiment of the present invention. Layer 700 comprises conductive material 702 through which holes 704 are formed. Similar to layers 500 (FIG. 5) and 600 (FIG. 6), insulated vias extend through holes 704, and contact vias are formed through the conductive material 702 between holes 704. In this manner, adjacent layers within the tier can be connected to power and ground, respectively, forming a parallel plate capacitor.

Contrasting layer 700 from layers 500 (FIG. 5) and 600 (FIG. 6), it is apparent that layer 700 has substantially fewer holes 704 through its conductive material 702. Because layer 700 has more conductive surface area, when layer 700 and an adjacent layer (not shown) are used to form a parallel plate capacitor, they are capable of storing more charge than capacitors formed from layer 500 and an adjacent layer or formed from layer 600 and an adjacent layer.

Although each line of holes in FIGS. 5–7 is shown to be staggered from adjacent lines of holes, the holes could be arranged in aligned grid patterns or other patterns, in other embodiments. In addition, the numbers of holes shown in FIGS. 5–7 are for illustration purposes only, and more or fewer holes could be used in various embodiments.

As a discrete device, capacitor 300 could be mounted on an electronic circuit package (either land side or die side), an interposer, a socket or a PC board. The way the capacitor is connected to the package, interposer, socket or PC board would depend on the technology used to package the capacitor. Capacitor 300 could be packaged in a ceramic, organic dielectric or other type of package using surface mount, bond wire, and/or other technologies. Methods of packaging a discrete capacitor, such as capacitor 300, are well known to those of skill in the art, and therefore are not discussed in detail herein. In some embodiments, capacitor 300 could be used as a discrete device without packaging.

Top connectors 340 and bottom connectors 342, in one embodiment, enable capacitor 300 to be mounted in between an integrated circuit and a package or socket. In such an embodiment, top connectors 340 can be electrically and mechanically connected to the bottom of an organic land grid array (OLGA) or flip chip pin grid array (FCPGA) type integrated circuit using solder connections. Bottom connectors 342 can then be electrically and mechanically connected to the top of a land grid array (LGA) socket.

In an alternate embodiment, capacitor 300 could be embedded within some type of housing, such as a package, interposer, socket or PC board. In such an embodiment, a cavity is formed in the housing, and capacitor 300 is fitted within the cavity. The cavity would then be filled, and additional layers could be built up over capacitor 300. Capacitor 300 is electrically connected to the top and/or bottom, and/or other layers of the housing using micro vias.

In still another alternate embodiment, capacitor 300 could be embedded within a housing by attaching capacitor 300 to a layer, building up layers over capacitor 300, and forming vias to electrically connect capacitor 300 with the top, and/or bottom, and or other layers within the housing. As will be described in more detail later, capacitor 300 can be connected to, embedded within or integrated within an integrated circuit, package, interposer, socket, or PC board in numerous other configurations and using various other connection technologies in other embodiments.

Figure 8:
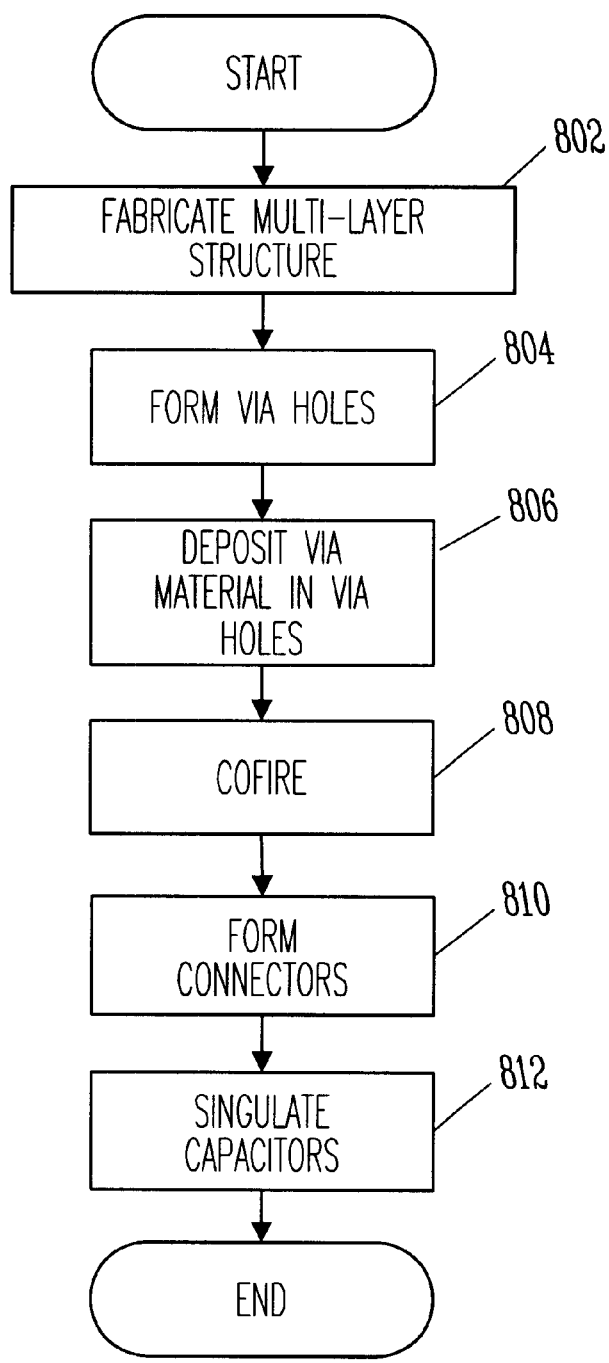
FIG. 8 illustrates a flowchart of a method for fabricating a multiple tier array capacitor in accordance with one embodiment of the present invention.
Figure 10:
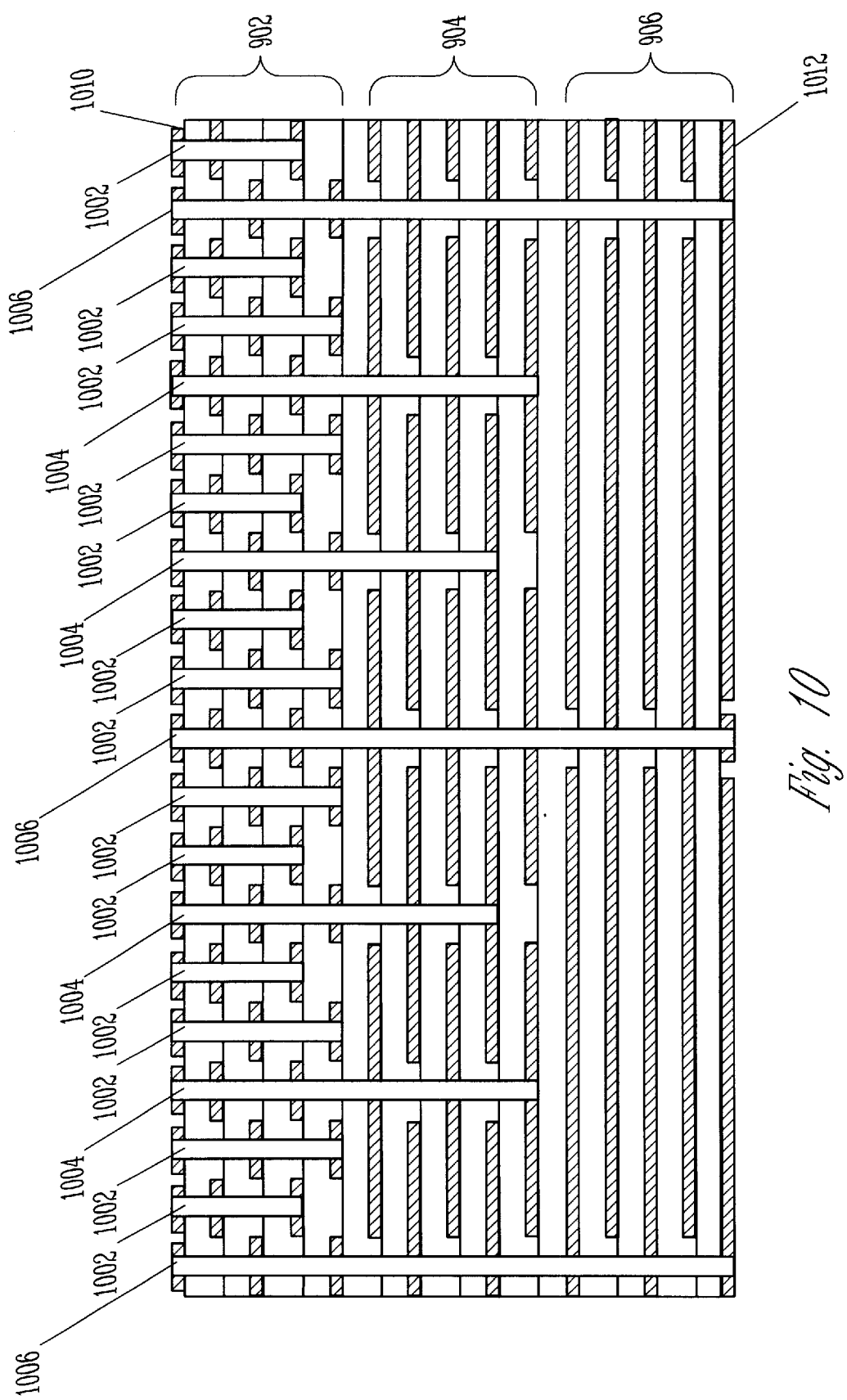
Figure 11:
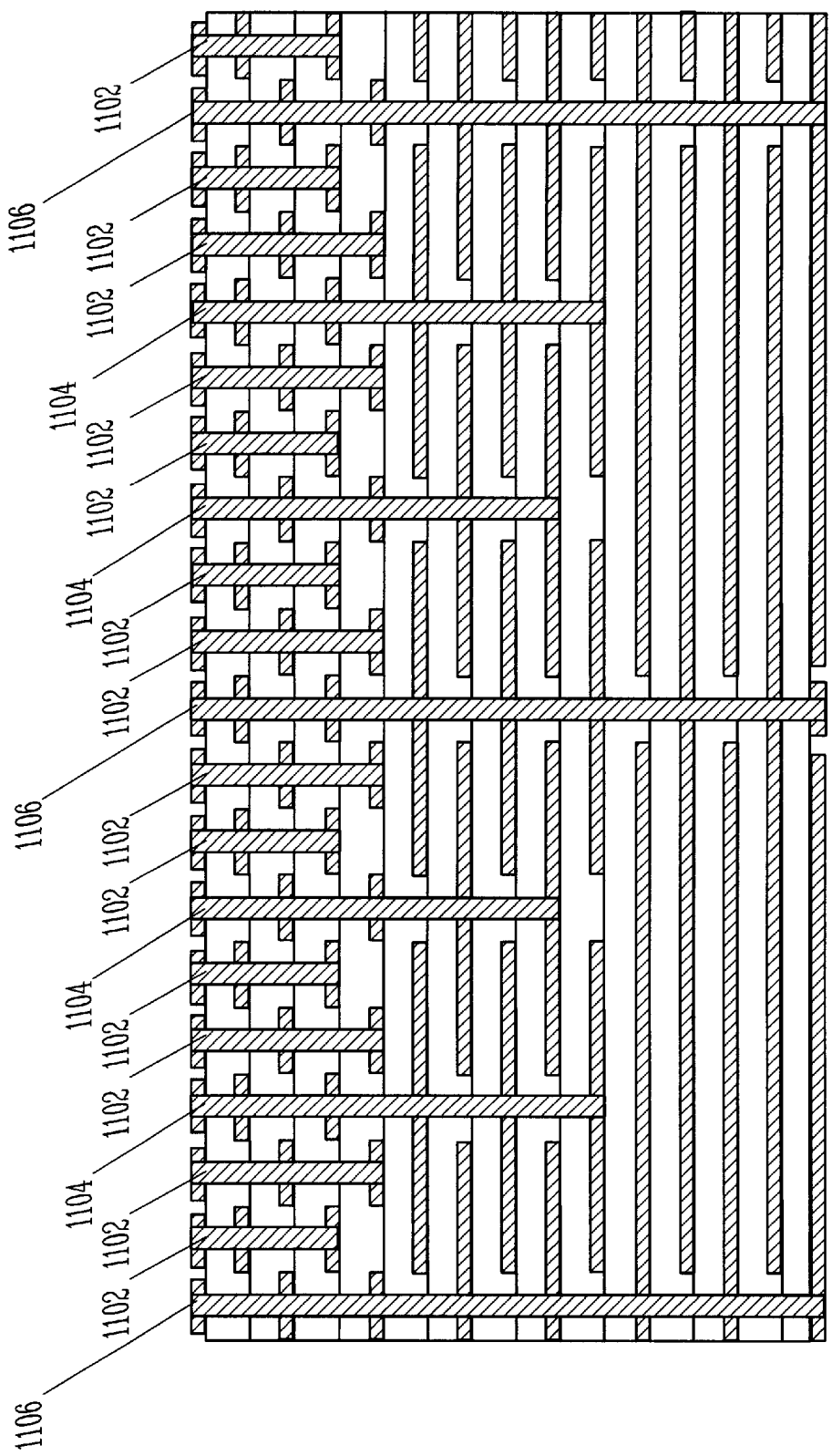

FIG. 8 illustrates a flowchart of a method for fabricating a multiple tier array capacitor (e.g., capacitor 300, FIG. 3) in accordance with one embodiment of the present invention. FIG. 8 should be viewed in conjunction with FIGS. 9–11, which are schematic cross-sections illustrating various stages of fabricating a multiple tier array capacitor in accordance with one embodiment of the present invention. In various embodiments, the multiple tier array capacitor (e.g., capacitor 300, FIG. 3) could be formed using ceramic multi-layer, organic, or thin-film processes. For ease of description, a method for forming a ceramic multi-layer capacitor is described in conjunction with FIG. 8, accompanied by descriptions of variations that apply to organic or thin-film processing. Because the specific fabrication techniques used in all of these technologies are well know to those of skill in the art, specific details of those fabrication techniques are not included in this description.

Figure 9:
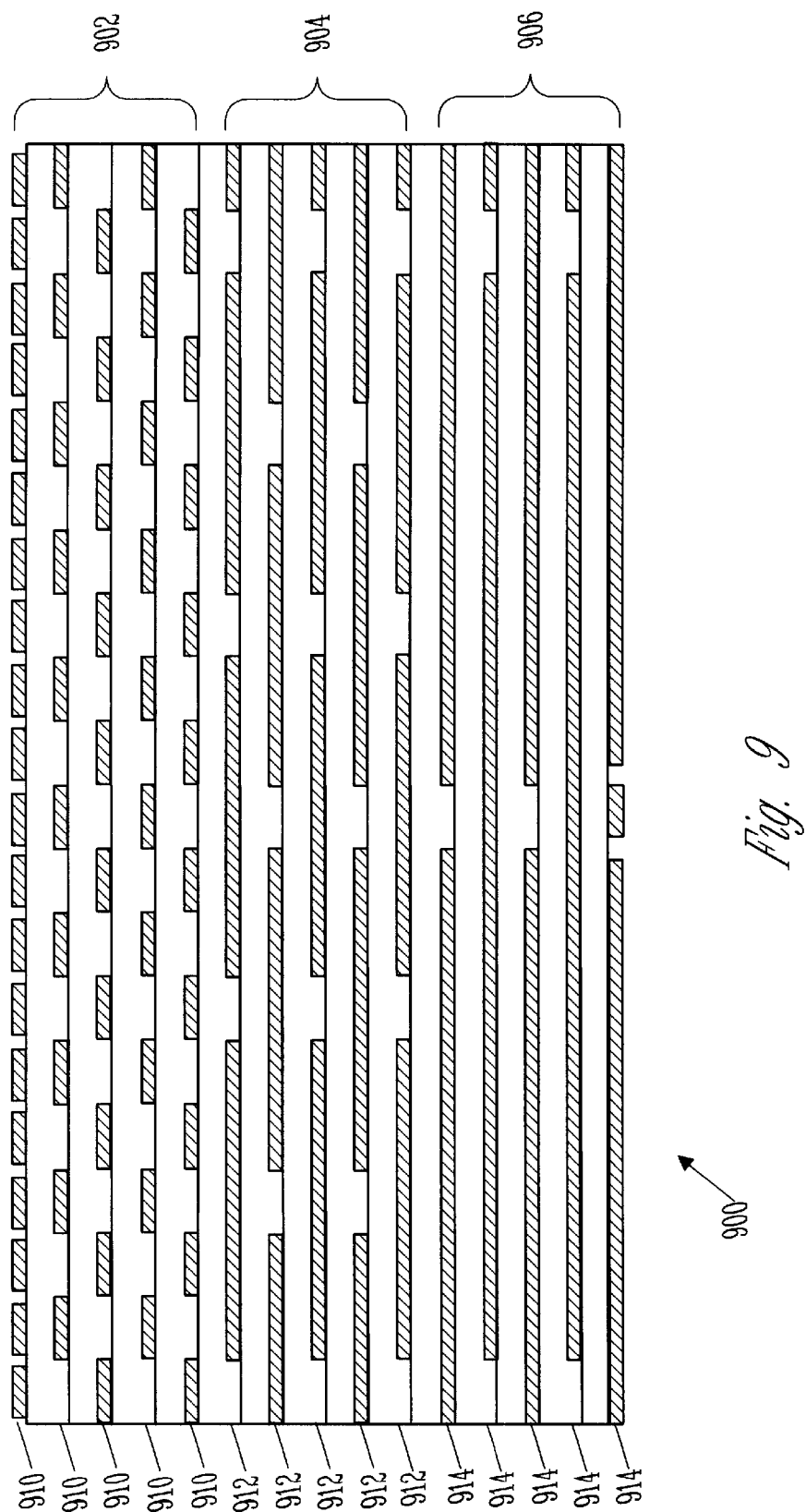
FIGS. 9–11 are schematic cross-sections illustrating various stages of fabricating a multiple tier array capacitor in accordance with one embodiment of the present invention.

The method begins, in block 802, by fabricating a multi-layer structure (e.g., structure 900, FIG. 9). The structure 900 includes multiple tiers 902, 904, 906 of capacitance, each tier having multiple layers 910, 912, 914 of patterned conductive material separated by dielectric material. Although three tiers 902, 904, 906 and fifteen layers 910, 912, 914 are shown in FIG. 9, more or fewer tiers and/or layers could be included in the structure 900 in other embodiments.

In one embodiment, structure 900 is formed using ceramic multi-layer processing techniques. Basically, conductive layers 910, 912, and 914 are screen printed on individual ceramic layers. These layers are then aligned, stacked together, and held in place, forming structure 900.

In an alternate embodiment, where structure 900 is formed using organic or thin film technologies, structure 900 is formed using a build up process. The build up process basically involves forming and patterning layers of dielectric and conductive materials on top of each other in a sequence.

Conductive layers 910, 912, 914 could be formed from various conductive materials, such as thick or thin film nickel, copper, sputtered conductors, or aluminum cap layers, in various embodiments, although other suitable conductive materials could be used as well. The dielectric material between layers 910, 912, 914 could be, for example, barium titanate ceramic, polymer films, or aluminum oxide layers, in various embodiments, although other dielectric materials could be used as well. In one embodiment, the dielectric material has a very high epsilon value in a range of 2000–5000, although dielectric materials having higher or lower epsilon values could be used as well. In addition, in one embodiment, the dielectric layers are very thin. For example, the dielectric layers could be in a range of 1–30 microns, although the layers could be thicker or thinner, in other embodiments.

In block 804, via holes (e.g., holes 1002, 1004, 1006, FIG. 10) are formed through the top surface 1010 of the structure. Using ceramic multi-layer technologies, via holes 1002, 1004, 1006 are formed through the stacked assembly of ceramic and conductive layers. In an alternate embodiment, via holes 1002, 1004, 1006 are formed in each ceramic layer prior to aligning and stacking the layers. Accordingly, blocks 802 and 804 would be combined processes. In alternate embodiments, where organic or thin-film build up technologies are used, via holes 1002, 1004, 1006 are formed after or during the building up of the layers.

Via holes could be formed using laser drilling, mechanical drilling, and/or mechanical pressing or punching, in various embodiments. Via holes 1002, 1004, 1006 form openings between the layers of various tiers 902, 904, 906 and the top surface of the structure. In one embodiment, some of the holes 1006 also form openings to the bottom surface 1012 of the structure. For example, holes 1002 form openings to some layers 910 of tier 902, holes 1004 form openings to some layers 910, 912 of tiers 902 and 904, and holes 1006 form openings to some layers 910, 912, 914 of tiers 902, 904, and 906. In one embodiment, holes 1006 are extended to the bottom surface of the capacitor, so that electrical connections eventually can be made to vias at the bottom surface.

As described previously, the holes 1002, 1004, 1006 form openings to every other layer 910, 912, 914. In this way, every other layer can be connected, in an alternating manner, to power or ground, thus providing a capacitive charge across the dielectric materials that separate the layers 910, 912, 914.

In block 806, conductive via material is deposited in the via holes, forming conductive vias (1102, 1104, 1106, FIG. 11) to the top and bottom surfaces of the structure. In one embodiment, where ceramic multi-layer technologies are used, the via holes are filled with a metal and glass frit paste, which is cofired with the ceramic in a cofiring process, in block 808. In other embodiments, the via holes are sputter deposited or electroplated with a metallic material. In still other embodiments where the vias are formed during a build-up process, the via holes can be filled during the build up of the layers. In those embodiments, blocks 802, 804, and 808 would be combined processes. In various embodiments, the via material could include copper, nickel or other suitable conductors.

After the capacitor structure and vias are completed, connectors (e.g., connectors 340, 342, FIG. 3) are formed on the top and bottom surfaces of the capacitor, in block 810. In one embodiment, the connectors are formed of a material that is suitable for reflow soldering or of a material suitable to be accessed after the capacitor is embedded on a substrate or within a housing, such as a package, interposer, socket or PC board.

In one embodiment, multiple capacitors are formed together. Thus, after the capacitors are formed, they are singulated, in block, 812. Singulating the capacitors can be performed using a laser or mechanical saw, for example. In another embodiment, each capacitor is formed individually, and singulation is not necessary. After singulating the capacitors, the method ends.

Although it is not always necessary or desirable to package the capacitors after they are fabricated and singulated, in some cases a packaging process may be desirable. Packaging each capacitor can be done using techniques that are well known by those of skill in the art. For example, the capacitor can be packaged using molded plastic, pressed ceramic, laminated ceramic/plastic or other technologies known to those of skill in the art. In some applications, where the capacitor is embedded within a housing or is attached directly to an integrated circuit, it might be undesirable to package the capacitor. In such cases, packaging is not performed. As described previously, the capacitor illustrated in FIG. 3 could be implemented as a discrete device that is mounted on or embedded within a housing, such as a package, socket, interposer, and/or PC board. In alternate embodiments, the capacitor could be integrated within such a housing during manufacture of the housing.

Figure 12:
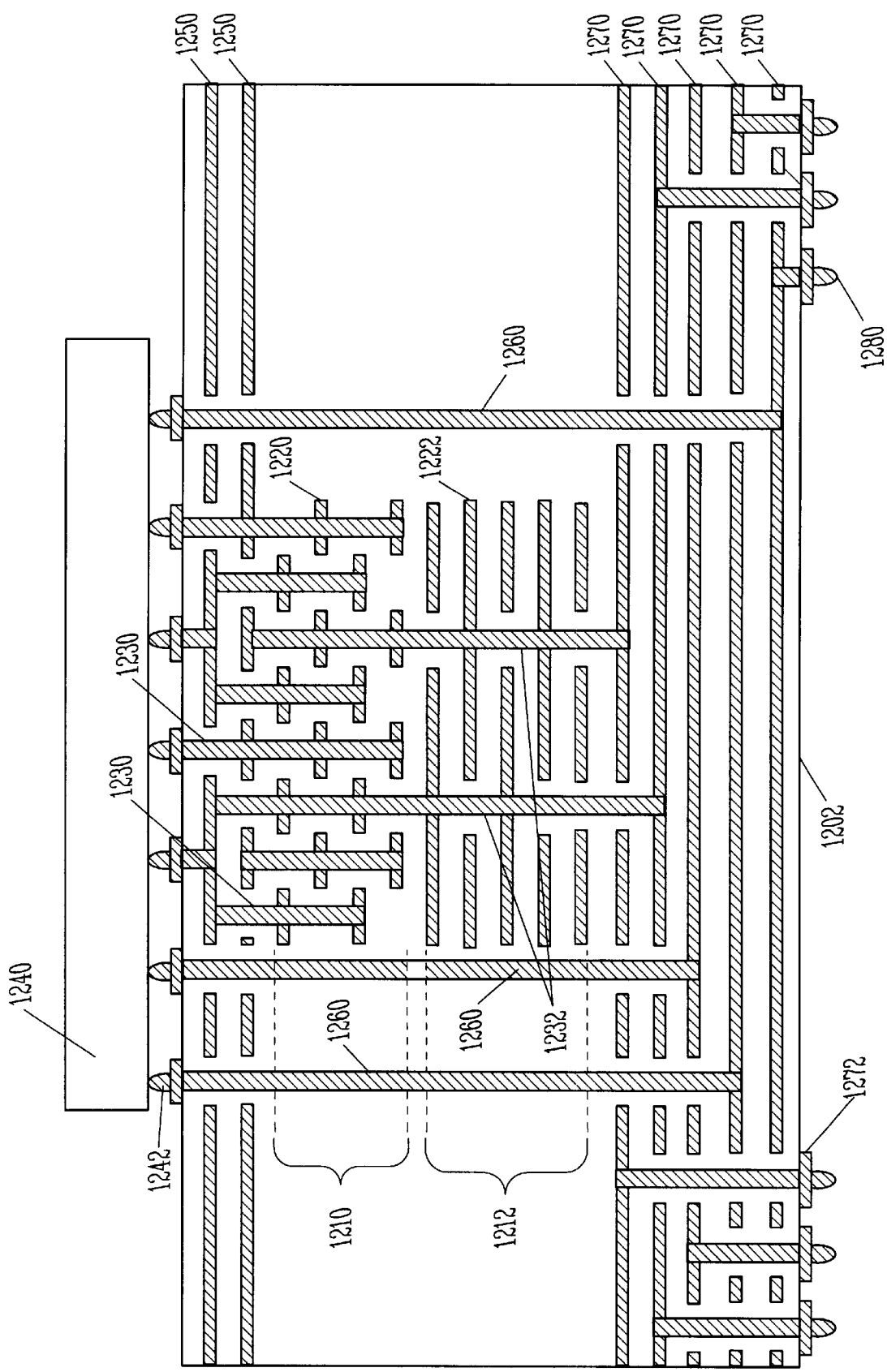
FIG. 12 illustrates a cross-section of an array capacitor integrated within an electronic circuit package in accordance with one embodiment of the present invention.

FIG. 12 illustrates a cross-section of an array capacitor integrated within an electronic circuit package 1202 in accordance with one embodiment of the present invention. Within its layers, package 1202 includes an integrated capacitor formed from two tiers 1210, 1212 of capacitance, referred to herein as "center tiers." Each tier 1210, 1212 includes multiple layers 1220, 1222 of patterned conductive material, where each layer is separated by dielectric material.

The integrated capacitor is electrically connected with other package layers and/or the top or bottom of package 1202 using vias 1230, 1232, referred to herein as "capacitor vias." Capacitor vias 1230 electrically connect to layers 1220 of the top tier 1210, and capacitor vias 1232 electrically connect to layers 1220, 1222 of the top and bottom tiers 1210, 1212.

In one embodiment, one or more patterned, conductive transition layers 1250 exist between integrated circuit 1240 and the top tier 1210. Transition layers 1250 provide for pitch conversion between the pitch (i.e., the center-to-center distance) of capacitor vias 1230, 1232 and the pitch of die side connectors 1242. Transition layers 1250 could be used for pitch conversion for other pad and die bump pitches in other ranges, as well. In another embodiment, where the pitch of capacitor vias 1230, 1232 and the pitch of die bumps 1242 can be more closely matched, transition layers 1250 could be eliminated or used for other purposes. In still another alternate embodiment, two or more layers of a top tier 1210 of an embedded capacitor structure can be used to provide pitch conversion, thus eliminating the need for transition layers 1250. Package 1202 also includes signal vias 1260, which carry signals between integrated circuit 1240 and one or more additional layers 1270 of package 1202. These additional layers 1270, referred to also as "fan-out layers," enable the signals carried on signal vias 1260 to be fanned out to pads 1272 and connectors 1280 on the bottom surface (i.e., the land side) of package 1202. The fan-out layers 1270 also enable power and ground to be conducted from the pads 1272 and connectors 1280 to the tiers 1212, 1210 of the multi-layer capacitor structure. In other words, the fan-out layers 1270 provide pitch conversion between the pitch of the land-side pads 1272 and the pitches of die bumps 1242 and/or vias 1232 corresponding to the lowest tier 1212. For example, fan-out layers 1270 could provide pitch conversion from 450 microns for land-side pads 1272 to 150 microns for die bumps 1242.

In another embodiment, some or all of the desired pitch conversion for power and ground can be achieved through the appropriate design of the pitches of vias in tiers 1210, 1212. Referring again to FIGS. 5–7, it is apparent that the pitch of vias in a top tier (FIG. 5) is less than the pitches of vias in lower tiers (FIGS. 6 and 7). Therefore, when a certain pitch conversion is desired for power and ground, this pitch conversion can be entirely or partially achieved by designing particular pitches between vias in the top and lower tiers.

For example, assume that the pitch of die bumps is 150 microns, and the pitch of land-side bond pads is 450 microns. In such a case, top tier 1210 could have a via pitch of 150 microns, and bottom tier 1212 could have a via pitch of 450 microns. In alternate embodiments, if more than two tiers of capacitance are implemented, the via pitches can incrementally increase from the top tier to the bottom tier, until the desired pitch conversion is achieved.

Although it may be desirable to accomplish the entire pitch conversion for power and ground through incremental increase in the via pitches in subsequently lower tiers, it also may be desirable to accomplish only part of the pitch conversion using the pitch variations between tiers. Using the example above, where the die bump pitch is 150 microns and the land-side bond pad pitch is 450 microns, tiers 1210, 1212 could be used to convert the pitch between vias to some intermediate value, such as 300 microns, for example. The pitch conversion from 300 microns to 450 microns would then be completed using fan-out layers 1270, as described previously.

The electrical characteristics of the integrated capacitor structure are described in detail, above, in conjunction with FIGS. 3–7. Basically, the structure provides two additional levels of decoupling capacitance to an integrated circuit 1240 attached to package 1202. The top tier 1210 provides a lower level of capacitance at a very low inductance, and the bottom tier 1212 provides a higher level of capacitance at a higher inductance.

In some cases, it may be desirable to provide even more levels of low-inductance decoupling capacitance to the integrated circuit. Alternatively, it may be desirable to have one or more tiers of capacitance below the center of the integrated circuit, and one or more additional tiers of capacitance in regions that are not below the integrated circuit.

Figure 13:
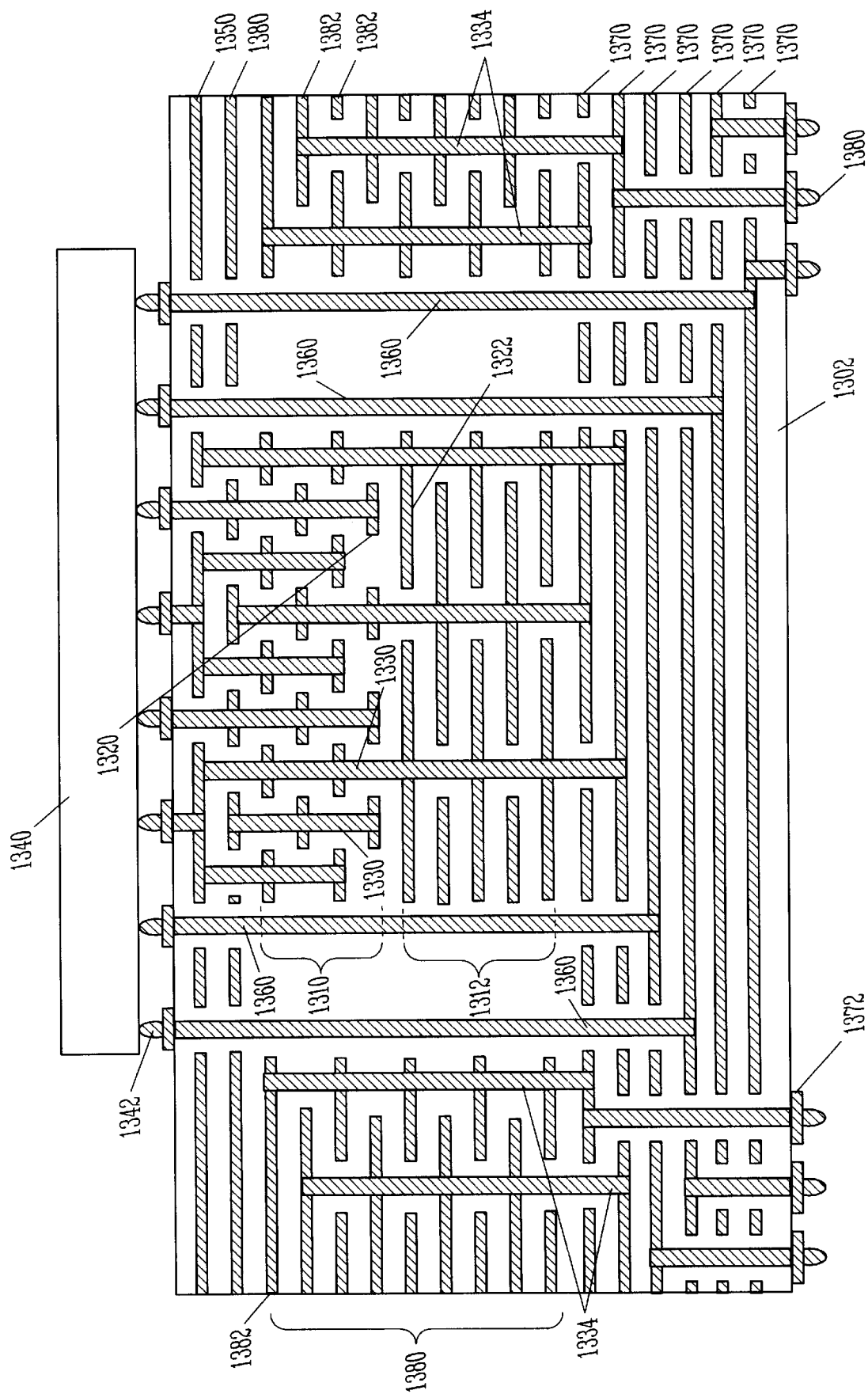
FIG. 13 illustrates a cross-section of an array capacitor integrated within an electronic circuit package in accordance with another embodiment of the present invention.

An embodiment that provides such additional capacitance is shown in FIG. 13, which illustrates a cross-section of an array capacitor integrated within an electronic circuit package 1302 in accordance with another embodiment of the present invention. The package 1302 shown in FIG. 13 is similar to the package 1202 shown in FIG. 12, in that package 1302 includes at least one center tier 1310, 1312 of capacitance located below an integrated circuit 1340 attached to package 1302. In addition, package 1302 includes one or more transition layers 1350, fan-out layers 1370, capacitor vias 1330, and signal vias 1360.

Unlike the embodiment shown in FIG. 12, however, the embodiment shown in FIG. 13 also includes one or more additional tiers 1380 of capacitance located in package regions that are not underneath integrated circuit 1340. These additional tiers 1380, referred to herein as "peripheral tiers," include at least two layers 1382 of patterned conductive material. In one embodiment, every other layer 1382 is connected, in an alternating manner, to power or ground, creating capacitive charges across the layers.

Connections between center tiers 1310, 1312 and peripheral tiers 1380 are made through fan-out layers 1370, in one embodiment, which are located substantially underneath the center tiers 1310, 1312 and peripheral tiers 1380. In another embodiment, center tiers 1310, 1312 and peripheral tiers 1380 could be connected through transition layers 1350, which are located between the integrated circuit 1340 and tiers 1310, 1312, and 1380. Although this might decrease the electrical distance and thus the inductance between peripheral tiers 1380 and integrated circuit 1340, it also could necessitate additional transition layers. These additional transition layers (not shown) would increase the electrical distance, and thus the inductance, between integrated circuit 1340 and center tiers 1310, 1312.

In still another embodiment, two or more layers of a tier 1310, 1312, 1380 can be used to connect center tiers 1310, 1312 and peripheral tiers 1380, thus eliminating the need for fan-out layers 1370 to provide that connection. As described in conjunction with FIG. 12, fan-out layers 1370 also could be used, in one embodiment, for pitch conversion between the pitch of die bumps 1342 and the pitch of land-side pads 1372. In one embodiment, the pitch conversion for power and ground can be provided entirely or partially by design of the pitches of vias 1330 of the capacitor structure, as described previously.

Because peripheral tiers 1380 are not as electrically close to integrated circuit 1340, they are slower to respond to the need for increased capacitance than are center tiers 1310, 1312. However, peripheral tiers 1380 will augment the amount of additional, decoupling capacitance provided by center tiers 1310, 1312.

The packages 1202, 1302 illustrated in FIGS. 12 and 13 could be fabricated using various technologies and materials that are well known to those of skill in the art. For example, packages 1202, 1302 could be formed using multi-layer ceramic, organic, thin film or other packaging technologies. In addition, the integrated circuits could be connected to the packages using various interconnection technologies, such as, for example, surface mount, bond wire, and/or other technologies. In addition, packages 1202, 1302 could be through-hole mounted or surface mounted to the next lower level of interconnect (e.g., an interposer, socket or PC board).

Although two tiers 1210, 1212, 1310, 1312 of inner capacitance, one tier of outer capacitance 1380, two transition layers 1250, 1350, and three fan-out layers 1270, 1370 are shown in FIGS. 12 and 13, more or fewer tiers, transition layers and/or fan-out layers could be implemented in various embodiments. For example, as described previously, the functionality of transition layers 1250, 1350 and/or fan-out layers 1270, 1370 could instead be implemented using layers of the capacitor tiers 1210, 1212, 1310, 1312, making the transition and/or fan-out layers unnecessary. In addition, the number of layers 1220, 1222, 1320, 1322, 1382 included in each tier could be larger or smaller than shown in FIGS. 12 and 13. Finally, the number of capacitor and signal vias 1230, 1232, 1330, 1332, 1334 connecting through each layer, and the number and orientation of die side connectors 1242, 1342 and land side connectors 1280, 1380 could be different from the number shown in FIGS. 12 and 13.

Figure 14:
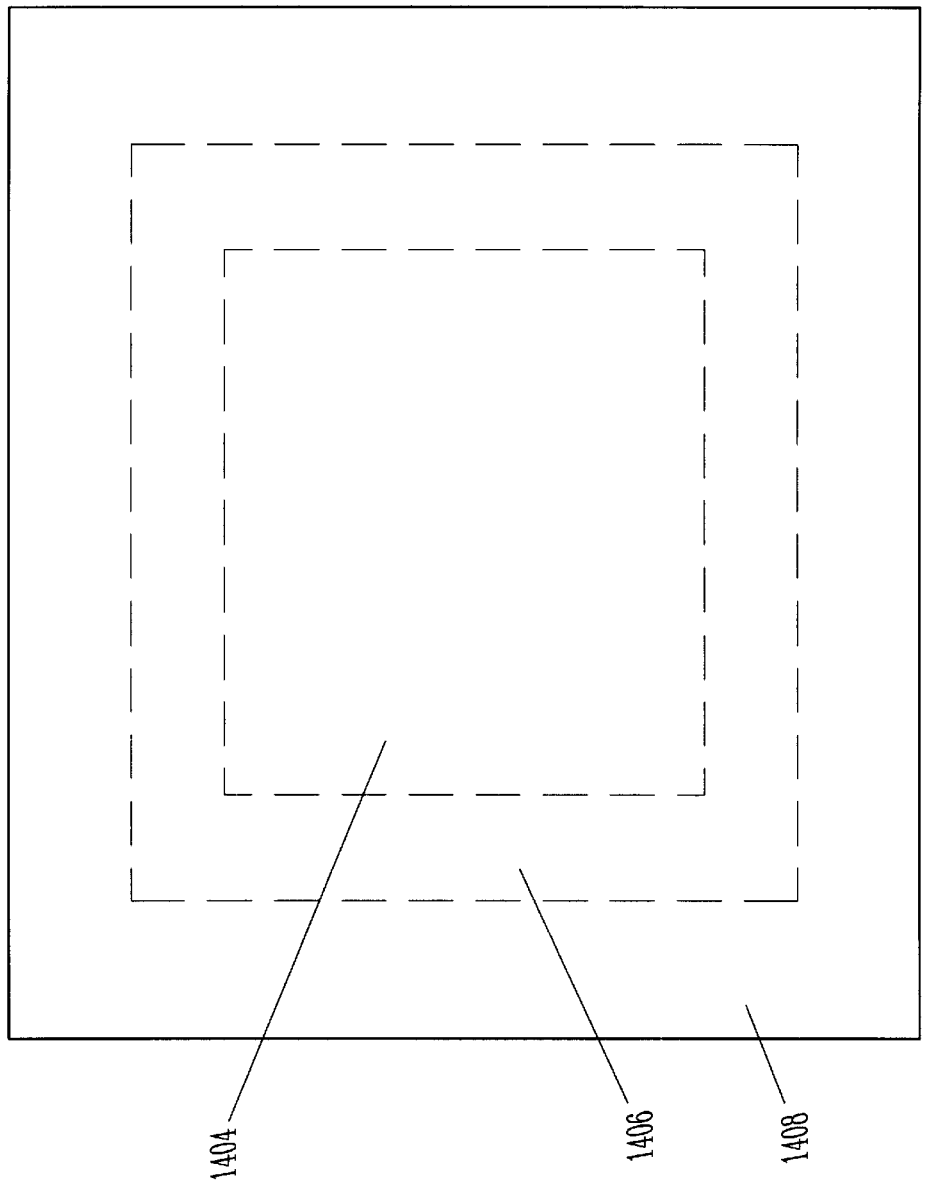
FIG. 14 illustrates a top view of an electronic circuit package, which includes an integrated array capacitor with multiple levels of capacitance in accordance with one embodiment of the present invention.

FIG. 14 illustrates a top view of an electronic circuit package 1400, which includes an integrated array capacitor with multiple levels of capacitance in accordance with one embodiment of the present invention. Package 1400 includes a center region 1404, located substantially underneath and in the center of an integrated circuit that will attach to package 1400. Within this region 1404, a center capacitor is formed from one or more tiers (e.g., tiers 1310, 1312, FIG. 13) of capacitance.

Package 1400 also includes a second region 1406. In one embodiment, second region 1406 also is located substantially underneath an integrated circuit, but outside the perimeter of center region 1404. Second region 1406 includes signal vias (e.g., vias 1360, FIG. 13), and portions of various conductive layers.

Finally, package 1400 includes a peripheral region 1408, which is not located underneath an integrated circuit that will attach to package 1400. In one embodiment, peripheral region 1408 includes one or more peripheral capacitors formed from one or more tiers (e.g., tier 1380, FIG. 13) of capacitance. The center capacitor within center region 1404 and the peripheral capacitor within peripheral region 1408 are electrically connected, in one embodiment, through fan-out layers (e.g., layers 1370, FIG. 13). In another embodiment, the center capacitor and the peripheral capacitor are electrically connected through two or more layers of the capacitors, making fan-out layers unnecessary.

Although the capacitor illustrated in FIGS. 13 and 14 is described as being integrated in a housing, the capacitor also could be implemented as a discrete device. As such, the various signal vias (e.g., vias 1360, FIG. 13) would be eliminated, and the region (e.g., second region 1406) where the signal vias exist could be reduced in size or eliminated. In addition, the device could be connected to other than an integrated circuit.

Figure 15:
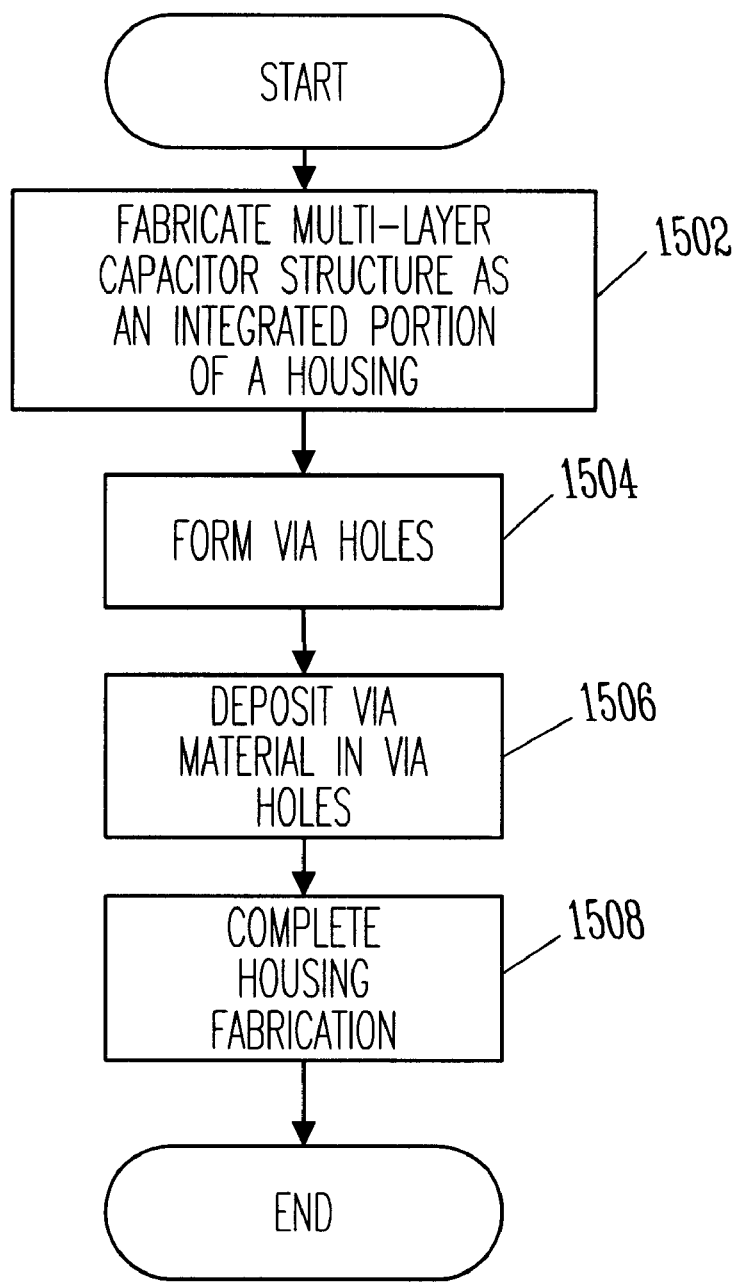
FIG. 15 illustrates a flowchart of a method for fabricating an integrated array capacitor with multiple levels of capacitance in a housing in accordance with one embodiment of the present invention.

FIG. 15 illustrates a flowchart of a method for fabricating an integrated array capacitor with multiple levels of capacitance in a housing in accordance with one embodiment of the present invention. In various embodiments, the housing and integrated array capacitor could be formed using ceramic multi-layer, organic, or thin-film processes. For ease of description, a method for forming a ceramic multi-layer housing is described in conjunction with FIG. 15, accompanied by descriptions of variations that apply to organic or thin-film processing. Because the specific fabrication techniques used in all of these technologies are well know to those of skill in the art, specific details of those fabrication techniques are not included in this description.

The method begins, in block 1502, by fabricating a multi-layer capacitor structure (e.g., structures 1202, 1302, FIGS. 12 and 13) as an integrated portion of a housing (e.g., a package, interposer, socket or PC board). The structure includes multiple tiers of capacitance, each tier having multiple layers of patterned conductive material separated by dielectric material. In one embodiment, a center capacitor having one or more tiers is formed substantially under a center region where an integrated circuit (or other device) will be attached, and a peripheral capacitor having one or more tiers is formed under a peripheral region where an integrated circuit will not be attached.

In one embodiment, the housing and capacitor structure are formed using ceramic multi-layer processing techniques. Basically, conductive layers are screen printed on individual ceramic layers. These layers are then aligned, stacked together, and held in place, forming the multi-layer housing and capacitor structure.

In an alternate embodiment, where the housing and capacitor structure is formed using organic or thin film technologies, a build up process is employed. The build up process basically involves forming and patterning layers of dielectric and conductive materials on top of each other in a sequence.

The housing and capacitor structure could be fabricated using various technologies and materials that are well known to those of skill in the art. For example, the housing and capacitor structure could be a multi-layer ceramic (e.g., pressed ceramic, high-temperature cofired ceramic, low-temperature cofired ceramic or ceramic ball grid array), organic or thin-film (e.g., pre- or post-molded plastic, laminated plastic or plastic ball grid array) or other type of housing (e.g., tape ball grid array, chip scale package, edge molded ball grid array, flip chip ball grid array or other package type).

The various conductive layers could be formed from various materials, such as thick or thin film nickel, copper, sputtered conductors, or aluminum cap layers, in various embodiments, although other suitable conductive materials could be used as well. The dielectric material between the layers could be, for example, barium titanate ceramic, polymer films, or aluminum oxide layers, in various embodiments, although other dielectric materials could be used as well. In one embodiment, the dielectric material has a very high epsilon value in a range of 2000–5000, although dielectric materials having higher or lower epsilon values could be used as well. In addition, in one embodiment, the dielectric layers are very thin. For example, the dielectric layers could be in a range of 1–30 microns, although the layers could be thicker or thinner, in other embodiments.

In block 1504, via holes are formed through the top surface of the housing. Using ceramic multi-layer technologies, the via holes are formed through the stacked assembly of ceramic and conductive layers. In an alternate embodiment, the via holes are formed in each ceramic layer prior to aligning and stacking the layers. Accordingly, blocks 1502 and 1504 would be combined processes. In alternate embodiments, where organic or thin-film build up technologies are used, the via holes are formed after or during the building up of the layers.

The via holes could be formed using laser drilling, mechanical drilling, and/or mechanical pressing or punching, in various embodiments. The via holes form openings between the one or more tiers of the center capacitor and the top surface of the housing.

In one embodiment, each via hole forms an opening to every other layer of the center capacitor. In this way, every other layer can be connected, in an alternating manner, to power or ground, thus providing a capacitive charge across the dielectric materials that separate the layers.

In block 1506, conductive via material is deposited in the via holes, forming conductive vias to the top surface of the housing. In one embodiment, where ceramic multi-layer technologies are used, the via holes are filled with a metal and glass frit paste, which is cofired with the ceramic. In other embodiments, the via holes are sputter deposited or electroplated with a metallic material. In still other embodiments where the vias are formed during a build-up process, the via holes can be filled during the build up of the layers. In those embodiments, blocks 1502 and 1504 would be combined processes. In various embodiments, the via material could include copper, nickel or other suitable conductors.

The housing fabrication is then completed, in block 1508. In an embodiment that uses organic or thin-film technologies, completing the housing fabrication may require building up additional layers of conductive and/or dielectric materials. In addition, housing fabrication is completed by providing connectors to an integrated circuit and/or to the next level of interconnect. For example, the housing could be connected to the integrated circuit using bond wire or surface mount technologies. In addition, the housing could be through-hole mounted or surface mounted to the next level of interconnect. After completing the housing fabrication, the method ends.

The structure described in conjunction with FIG. 15 could be integrated into various different types of housings, such as a package, an interposer, socket or PC board, in various embodiments. The way that the structure is integrated into the particular housing depends on the technology used to fabricate the housing. Many different techniques are known to those of skill in the art, and those techniques are not discussed in detail herein.

Figure 16:
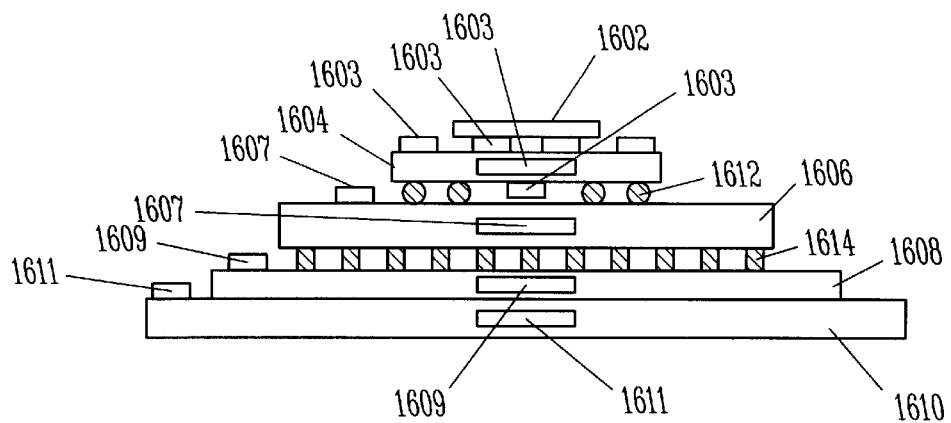
FIG. 16 illustrates an integrated circuit package, interposer, socket, and printed circuit board, each of which could include one or more mounted, embedded, and/or integrated capacitors in accordance with various embodiments of the present invention.

As described previously, a capacitor structure, such as those illustrated in FIGS. 3, 12 and 13, can be mounted on, embedded within, or integrated within an integrated circuit package, interposer, socket, and/or PC board. FIG. 16 illustrates an integrated circuit package 1604, interposer 1606, socket 1608, and PC board 1610, each of which could include one or more mounted, embedded, and/or integrated capacitors in accordance with various embodiments of the present invention.

Starting from the top of FIG. 16, an integrated circuit 1602 is housed by integrated circuit package 1604. Integrated circuit 1602 contains one or more circuits, which are electrically connected to integrated circuit package 1604 by connectors (not shown).

Integrated circuit 1602 could be any of a number of types of integrated circuits. In one embodiment of the present invention, integrated circuit 1602 is a microprocessor, although integrated circuit 1602 could be a memory device, application specific integrated circuit, digital signal processor, or another type of device in other embodiments. In the example shown, integrated circuit 1602 is a "flip chip" type of integrated circuit, meaning that the input/output terminations on the chip can occur at any point on its surface. After the chip has been readied for attachment to integrated circuit package 1604, it is flipped over and attached, via solder bumps or balls to matching pads on the top surface of integrated circuit package 1604. Alternatively, integrated circuit 1602 could be wire bonded, where input/output terminations are connected to integrated circuit package 1604 using bond wires to pads on the top surface of integrated circuit package 1604.

One or more of the circuits within integrated circuit 1602 acts as a load, which may require capacitance, noise suppression, and/or voltage dampening. Some of this capacitance is provided, in one embodiment of the present invention, by capacitors 1603 mounted on, embedded within or integrated within package 1604.

In this manner, one or more levels of additional capacitance are provided to integrated circuit 1602, also providing voltage dampening and noise suppression, when needed. The close proximity of these off-chip sources of capacitance means that each source has a relatively low inductance path to the die. In other embodiments, the capacitors 1607, 1609, 1611 are mounted on, embedded within or integrated within the interposer 1606, socket 1608, PC board 1610 or some combination thereof.

Integrated circuit package 1604 is coupled to interposer 1606 using solder connections, such as ball grid array connections 1612, for example. In another embodiment, integrated circuit package 1604 could be electrically and physically connected to interposer 1606 using a pinned or other type of connection.

Interposer 1606 is coupled to PC board 1610 through a socket 1608 on PC board 1610. In the example shown, interposer 1606 includes pins 1614, which mate with complementary pin holes in socket 1608. Alternatively, interposer 1606 could be electrically and physically connected to PC board 1610 using solder connections, such as ball grid array connections, for example. In still another alternate embodiment, integrated circuit package 1604 could be connected directly to socket 1608 and/or PC board 1610, without using an interposer. In such an embodiment, integrated circuit package 1604 and PC board 1610 could be electrically and physically connected using ball grid array or pinned connections. Other ways of connecting integrated circuit package 1604 and PC board 1610 could also be used in other embodiments.

Printed circuit board 1610 could be, for example, a motherboard of a computer system. As such, it acts as a vehicle to supply power, ground, and signals to integrated circuit 1602. These power, ground, and other signals are supplied through traces or planes (not shown) on or within PC board 1610, socket 1608, pins 1614, interposer 1606, and integrated circuit package 1604.

Figure 17:
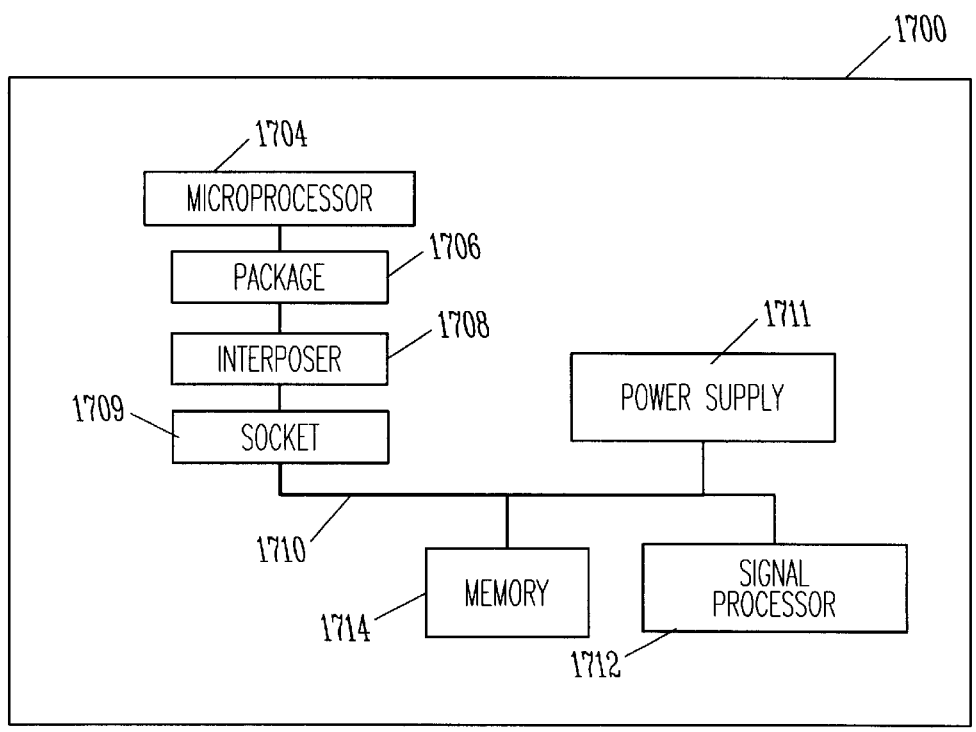
FIG. 17 illustrates a general-purpose electronic system in accordance with one embodiment of the present invention.

The configuration described above in conjunction with various embodiments could form part of a general purpose electronic system. FIG. 17 illustrates a general purpose electronic system 1700 in accordance with one embodiment of the present invention. System 1700 could be, for example, a computer, a wireless or wired communication device (e.g., telephone, modem, cell phone, pager, radio, etc.), a television, a monitor, or virtually any other type of electronic system.

The electronic system is housed on one or more PC boards, and includes microprocessor 1704, integrated circuit package 1706, interposer 1708, socket 1709, bus 1710, power supply 1711, signal processor 1712, and memory 1714. Integrated circuit package 1706, interposer 1708, socket 1709, and/or the PC board include one or more capacitors that are mounted on, embedded within and/or integrated within them in accordance with various embodiments of the present invention. Integrated circuit package 1706, interposer 1708, and socket 1709 couple microprocessor 1704 to bus 1710 in order to deliver power and communication signals between microprocessor 1704 and devices coupled to bus 1710. In one embodiment, bus 1710 couples microprocessor 1704 to memory 1714, power supply 1711, and signal processor 1712. However, it is to be understood that in alternative embodiments of the present invention, microprocessor 1704 can be coupled to memory 1714, power supply 1711, and signal processor 1712 through different busses.

CONCLUSION

Various embodiments of a capacitor structure and methods of fabricating that structure have been described, along with a description of the incorporation of the capacitor structure within a general-purpose electronic system. While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description of the preferred embodiments, reference is made to the accompanying drawings, which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, additional layers of patterned conductive materials and interconnects for carrying signals, power, and ground may exist between, above, between, or below the layers and tiers that form the capacitor structures, which are shown in the figures.

The various embodiments have been described in the context of providing excess, off-chip capacitance to a die. One of ordinary skill in the art would understand, based on the description herein, that the method and apparatus of the present invention could also be applied in many other applications where a capacitor having a low inductance path to a circuit load is desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. A capacitor comprising:
   a first tier of capacitance, which includes multiple first layers of patterned conductive material separated by multiple first layers of dielectric material;
   a first number of first capacitor vias, which extend from a top surface of the capacitor through the multiple first layers of patterned conductive material and the multiple first layers of dielectric material, wherein some of the first capacitor vias make electrical contact with a first set of layers that includes every other one of the multiple first layers, and others of the first capacitor vias make electrical contact with a second set of layers that includes a remainder of the multiple first layers;
   a second tier of capacitance, located substantially underneath the first tier of capacitance and electrically connected to the first tier of capacitance, which includes multiple second layers of patterned conductive material separated by multiple second layers of dielectric material; and
   a second number of second capacitor vias, which extend through the multiple second layers of patterned conductive material and the multiple second layers of dielectric material, wherein some of the second capacitor vias make electrical contact with every other one of the multiple second layers, and others of the second capacitor vias make electrical contact with a remainder of the multiple second layers.

2. The capacitor as claimed in claim 1, wherein the second capacitor vias extend through the multiple first layers, wherein some of the second capacitor vias make electrical contact with the first set of layers, and others of the second capacitor vias make electrical contact with the second set of layers.

3. The capacitor as claimed in claim 2, wherein the first number of first capacitor vias is greater than the second number of second capacitor vias.

4. The capacitor as claimed in claim 2, wherein the second capacitor vias extend to a bottom surface of the capacitor so that electrical connections can be made to the second capacitor vias at the bottom surface.

5. The capacitor as claimed in claim 1, further comprising:
   at least one additional tier of capacitance, electrically connected between the first tier of capacitance and the second tier of capacitance, which includes multiple additional layers of patterned conductive material; and
   additional capacitor vias, which extend through the multiple additional layers, wherein some of the additional capacitor vias make electrical contact with every other one of the multiple additional layers, and others of the additional capacitor vias make electrical contact with a remainder of the multiple additional layers.

6. The capacitor as claimed in claim 1, wherein the capacitor is a discrete device.

7. A capacitor comprising:
   a first tier of capacitance, which includes multiple first layers of patterned conductive material separated by layers of dielectric material;
   a first number of first capacitor vias, which extend from a top surface of the capacitor through the multiple first layers, wherein some of the first capacitor vias make electrical contact with every other one of the multiple first layers, and others of the first capacitor vias make electrical contact with a remainder of the multiple first layers;
   a second tier of capacitance, electrically connected to the first tier of capacitance, which includes multiple second layers of patterned conductive material; and
   a second number of second capacitor vias, which extend through the multiple second layers, wherein some of the second capacitor vias make electrical contact with every other one of the multiple second layers, and others of the second capacitor vias make electrical contact with a remainder of the multiple second layers,
   wherein the capacitor is a discrete device, and
   wherein the first tier of capacitance is located in a center region of the capacitor, and the second tier of capacitance is located in a peripheral region of the capacitor.

8. The capacitor as claimed in claim 1, wherein the capacitor is a ceramic capacitor.

9. The capacitor as claimed in claim 1, wherein the first tier of capacitance and the second tier of capacitance are integrated within a housing.

10. A capacitor comprising:
    a first tier of capacitance, which includes multiple first layers of patterned conductive material separated by layers of dielectric material;
    a first number of first capacitor vias, which extend from a top surface of the capacitor through the multiple first layers, wherein some of the first capacitor vias make electrical contact with every other one of the multiple first layers, and others of the first capacitor vias make electrical contact with a remainder of the multiple first layers;
    a second tier of capacitance, electrically connected to the first tier of capacitance, which includes multiple second layers of patterned conductive material; and
    a second number of second capacitor vias, which extend through the multiple second layers, wherein some of the second capacitor vias make electrical contact with every other one of the multiple second layers, and others of the second capacitor vias make electrical contact with a remainder of the multiple second layers,
    wherein the first tier of capacitance and the second tier of capacitance are integrated within a housing, and
    wherein the first tier of capacitance is located in a center region of the housing, and the second tier of capacitance is located in a peripheral region of the housing.

11. A capacitor comprising:
    a first tier of capacitance located in a center region of the capacitor, which includes multiple first layers of patterned conductive material separated by layers of dielectric material;
    a first number of first capacitor vias, which extend from a top surface of the capacitor through the multiple first layers, wherein some of the first capacitor vias make electrical contact with every other one of the multiple first layers, and others of the first capacitor vias make electrical contact with a remainder of the multiple first layers;
    a second tier of capacitance located in a peripheral region of the capacitor, electrically connected to the first tier of capacitance, which includes multiple second layers of patterned conductive material; and a second number of second capacitor vias, which extend through the multiple second layers, wherein some of the second capacitor vias make electrical contact with every other one of the multiple second layers, and others of the second capacitor vias make electrical contact with a remainder of the multiple second layers.

12. The capacitor as claimed in claim 11, wherein the capacitor is a discrete device.

13. The capacitor as claimed in claim 12, wherein the capacitor is a ceramic capacitor.

14. The capacitor as claimed in claim 11, wherein the first tier of capacitance and the second tier of capacitance are integrated within a housing.

* * * * *

UNITED STATES PATENT AND TRADEMARK OFFICE
CERTIFICATE OF CORRECTION

PATENT NO. : 6,532,143 B2
DATED : March 11, 2003
INVENTOR(S) : Larry E. Mosley et al.

It is certified that error appears in the above-identified patent and that said Letters Patent is hereby corrected as shown below:

Title page,
Item [56], References Cited, U.S. PATENT DOCUMENTS, insert
-- ............ 361/306.3 -- after "Kuroda et al." and insert
-- ............ 361/302 -- after "Wolf et al."

Signed and Sealed this

Twenty-first Day of June, 2005

JON W. DUDAS
*Director of the United States Patent and Trademark Office*